United States Patent
Van Beek et al.

(10) Patent No.: US 8,822,254 B2
(45) Date of Patent: Sep. 2, 2014

(54) MEMS DEVICE AND MANUFACTURING METHOD

(75) Inventors: Jozef Thomas Martinus Van Beek, Rosmalen (NL); Klaus Reimann, Eindhoven (NL); Remco Henricus Wilhelmus Pijnenburg, Hoogeloon (NL); Twan Van Lippen, Bladel (NL)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 13/312,503

(22) Filed: Dec. 6, 2011

(65) Prior Publication Data
US 2012/0139065 A1 Jun. 7, 2012

(30) Foreign Application Priority Data
Dec. 6, 2010 (EP) ..................................... 10193851

(51) Int. Cl.
*H01L 21/00* (2006.01)
*H01L 29/84* (2006.01)

(52) U.S. Cl.
USPC .......................... 438/52; 257/420; 257/E21.52

(58) Field of Classification Search
CPC ........................ H01H 59/0009; G01P 15/0802
USPC .................. 438/52; 216/11; 257/E21.52, 420
See application file for complete search history.

(56) References Cited

U.S. PATENT DOCUMENTS

| | | | |
|---|---|---|---|
| 6,413,793 B1* | 7/2002 | Lin et al. | 438/50 |
| 2002/0071170 A1* | 6/2002 | Miller et al. | 359/291 |
| 2005/0012975 A1* | 1/2005 | George et al. | 359/223 |
| 2006/0087716 A1* | 4/2006 | Kweon et al. | 359/290 |
| 2007/0215965 A1* | 9/2007 | Yang et al. | 257/415 |
| 2008/0054756 A1* | 3/2008 | Gogoi et al. | 310/307 |
| 2011/0316101 A1* | 12/2011 | Dang et al. | 257/418 |

OTHER PUBLICATIONS

Tas, N. et al. "Striction in Surface Micromachining", J. of Micromechanics & Microengineering, vol. 6, No. 4, pp. 385-397 (1996).
Mastrangelo, C. H. "Adhesion-Related Failure Mechanisms in Micromechanical Devices", Tribology Letters 3, pp. 223-238 (1997).
Kiihamaki, J. et al. "PLUG-UP—A New Concept for Fabricating SOI MEMS Devices", IEEE 2003 Design, Test, Integration and Packaging of MEMS/MOEMS, pp. 229-233 (2003).
Extended European Search Report for Patent Appln. 10193851.2 (Jun. 22, 2011).

* cited by examiner

*Primary Examiner* — Caridad Everhart

(57) ABSTRACT

A MEMS manufacturing method and device in which a spacer layer is provided over a side wall of at least one opening in a structural layer which will define the movable MEMS element. The opening extends below the structural layer. The spacer layer forms a side wall portion over the side wall of the at least one opening and also extends below the level of the structural layer to form a contact area.

13 Claims, 4 Drawing Sheets

MEMS DEVICE AND MANUFACTURING METHOD

This application claims the priority under 35 U.S.C. §119 of European patent application no. 10193851.2, filed on Dec. 6, 2010, the contents of which are incorporated by reference herein.

FIELD OF THE INVENTION

This invention relates to MEMS devices generally, which include a movable element which moves towards and away from an adjacent surface.

BACKGROUND OF THE INVENTION

MEMS pressure sensors, microphones, accelerometers, gyroscopes, switches, resonators and ultrasound transducers are examples that use movable membranes or beams.

A MEMS galvanic switch is one example of MEMS device which uses a movable element. A MEMS switch comprises a first electrode arrangement that is present on a substrate and a movable element that overlies at least partially the first electrode arrangement. The movable element is movable towards the substrate between a first and a second position by application of an actuation voltage, providing electrostatic attraction.

In the first position, the movable element is separated from the substrate by a gap. The movable element comprises a second electrode that faces the first electrode arrangement. In the second position (closed switch) first and second electrodes are in mechanical and electrical contact with each other.

Known MEMS switches of this type can use electrostatic actuation in which electrostatic forces resulting from actuation drive voltages cause the switch to close. An alternative type uses piezoelectric actuation, in which drive signals cause deformation of a piezoelectric beam.

Electrostatic galvanic MEMS switches are promising devices. They usually have 4 terminals: signal input, signal output, and two actuation terminals, one of which usually is kept at ground potential. By varying the voltage on the other actuation terminal, an electrostatic force is generated which pulls the movable structure downward. If this voltage is high enough, one or more contact bump electrodes will touch and will provide a galvanic connection between the two signal terminals.

FIGS. 1 and 2 show one possible design of MEMS galvanic switch designed in accordance with known design principles.

In FIG. 1, the cross hatched pattern is the bottom electrode layer. This defines the signal in electrode 10, the signal out electrode 12 and lower actuation electrode pads 14. As shown, the actuation electrode pads 14 are grounded.

A top electrode layer defines the movable contact element 16 as well as the second actuation electrode 18 to which a control signal ("DC act") is applied.

The second actuation electrode 18 has a large area overlapping the ground actuation pads so that a large electrostatic force can be generated. However, because the top actuation electrode 18 and the movable contact element 16 are formed from the same layer, a space is provided around the movable contact element 16.

FIG. 2 shows the device in cross section taken through a vertical line in FIG. 1. The same components are given the same reference numbers. FIG. 2 additionally shows the substrate arrangement 2 and the gap 20 beneath the movable contact element 16.

The connection between the signal input and signal output electrodes is made by the movable contact electrode which has two contact bumps as shown in FIG. 2. Galvanic MEMS switches can achieve low resistances $R_{on}$ of less then 0.5 Ohm when they are switched on, and high isolation with small parasitic capacitance when they are off ($C_{off}$<50 fF). Typical dimensions are 30 to 100 μm outer diameter of the actuation electrode 18.

The device is manufactured in well known manner, in which sacrificial etching defines the gap 20. Patterned etching of the sacrificial layer enables the contact bumps to be formed.

There is a general need to balance the requirement for low resistance contacts with the requirement to prevent sticking and arcing of the switch by ensuring that the actuating mechanism has sufficient restoring force to return the switch to its unactuated state once the contact force is removed.

A MEMS switch is one example of device where the movable beam deliberately makes contact with an underlying surface.

An example of a MEMS device in which contact is not made during normal operation is a MEMS microphone. FIG. 3 is an example of a MEMS condenser microphone. The sound pressure can be applied from the bottom or from the top.

The structure is formed on a silicon on insulator substrate 30, and comprises a top electrode 31 suspended by a spacer layer 32 over a movable electrode membrane 34.

The microphone is formed as an integrated MEMS device, in which the movable membrane 34 is suspended over an opening in the semiconductor substrate 30. The top electrode 31 functions as a back electrode and has perforations to allow the flow of air so that the membrane can move. The membrane is exposed to the sound pressure at an acoustic inlet beneath the substrate opening, and the microphone is enclosed in a package with sufficient volume of air to not hamper the membrane movement.

The capacitance between the two electrodes 31 and 34 defines the electrical microphone signal.

The microphone has an essentially linear response to the sound pressure when it is within limits. In the event of high sound pressure, the movable membrane makes contact with the perforated back electrode.

A well known failure mode observed in micro-mechanical systems (MEMS) is stiction of moveable elements. Stiction means that the moveable element is stuck to a fixed part of the device. The device loses its functionality.

This problem can arise especially in devices where contact between the movable element and the underlying substrate is not a normal part of the device operation. For example, MEMS microphones, accelerometers, resonators, variable capacitors or switches can all employ vertically movable elements, which do not necessarily need to make contact for normal operation of the device.

This stiction can be caused for example by surface tension of liquids during processing of the MEMS. During operation, adhesion, moisture effects, electrostatic forces and dielectric charging can lead to stiction as well. The stiction force increases when the area of contacting surfaces increases. Therefore, decreasing the area of contacting surfaces is an effective way of avoiding permanent stiction and failure of the MEMS device. This is one purpose of the contact bumps in FIG. 2.

Electrostatic forces (when a bias voltage is applied) and dielectric charging can keep the membrane in the stuck position after the membrane was brought into contact with the counter electrode. The thinner the dielectric between membrane and counter-electrode, the higher is the electrostatic force. Electrostatic MEMS devices therefore exhibit an electrostatic hysteresis and can only be released after contact by lowering the applied voltage. This effect can be reduced by a smaller contact area, but also by adding an insulator or increasing the insulator thickness between the (conducting) surfaces.

Manufacturing such bumps for addressing the stiction problem typically requires extra layers and extra mask steps during manufacturing.

The invention relates to designs and manufacturing methods for providing the desired low contact area and/or dielectric thickness in order to address the stiction problems explained above.

SUMMARY OF THE INVENTION

According to the invention, there is provided a method of manufacturing a MEMS device, comprising:

forming a sacrificial layer arrangement over a substrate;

forming a structural layer over the sacrificial layer arrangement;

patterning the structural layer to define at least one opening and partially etching the sacrificial layer arrangement at the base of the opening;

forming a spacer layer at least partially over the structural layer, over a side wall of the at least one opening and over the partially etched sacrificial layer arrangement at the base of the opening, which side wall portion extends below the level of the structural layer; and at least partially removing the sacrificial layer arrangement to form a suspended movable MEMS element.

The portion of the spacer layer which extends below the structural layer essentially forms a contact bump. This method thus forms a contact bump underneath the movable MEMS element as a layer which lines the inner side wall of an opening. The thickness of the layer over the side wall thus translates into a dimension of the area of the contact bump, and this means the area can be made very small.

The invention enables contact bumps to be formed without significantly increasing the complexity of the manufacturing method. In particular, It reduces the number of required masks and hence saves cost. The contact area can be made very small, even with low lithographic resolution.

In devices that normally make mechanical contact, the invention can help to reduce hysteresis and improve reliability, in addition to reducing the occurrence of stiction. In devices that normally do not make mechanical contact, the invention can help to reduce the stiction problem than can arise.

Before at least partially removing the sacrificial layer, the spacer layer can be removed from the structural layer but leaving the side wall portion over the side wall of the at least one opening.

At least partially removing the sacrificial layer arrangement can comprise using the at least one opening as an etch hole. Thus, the etch holes which need to be etched into the movable element to enable the sacrificial release process can also be used for forming the contact bumps.

Removing the spacer layer from the structural layer can comprise performing an anisotropic etch step. This means a vertical channel can be formed so that the side walls are left intact, including the part of the side walls extending below the structural layer.

At least partially removing the sacrificial layer arrangement comprises performing an isotropic etch step, as is conventional for a sacrificial etch process.

The spacer layer can comprise an insulator. This assists in reducing the electrostatic forces, for examples where electrical contact is not needed.

The invention also provides a MEMS device comprising:

a substrate;

a suspended movable MEMS element over the substrate defined by a structural layer, wherein the MEMS element has at least one opening having a side wall, wherein a spacer layer is provided over the side wall of the at least one opening and extending below the level of the structural layer, thereby defining projections beneath the structural layer.

The device can comprise a MEMS switch, capacitor, resonator, accelerometer, gyrometer, pressure sensor, ultrasound transducer or microphone.

BRIEF DESCRIPTION OF THE DRAWINGS

These and other aspects of the device of the invention will be further explained with reference to the Figures, in which.

DETAILED DESCRIPTION OF EMBODIMENTS

The invention provides a manufacturing method in which a spacer layer is provided over a side wall of at least one opening in a structural layer, which will define the movable MEMS element. The opening extends below the structural layer. The spacer layer forms a side wall portion over the side wall of the at least one opening, which extends below the level of the structural layer to form a contact area.

Figure 1:
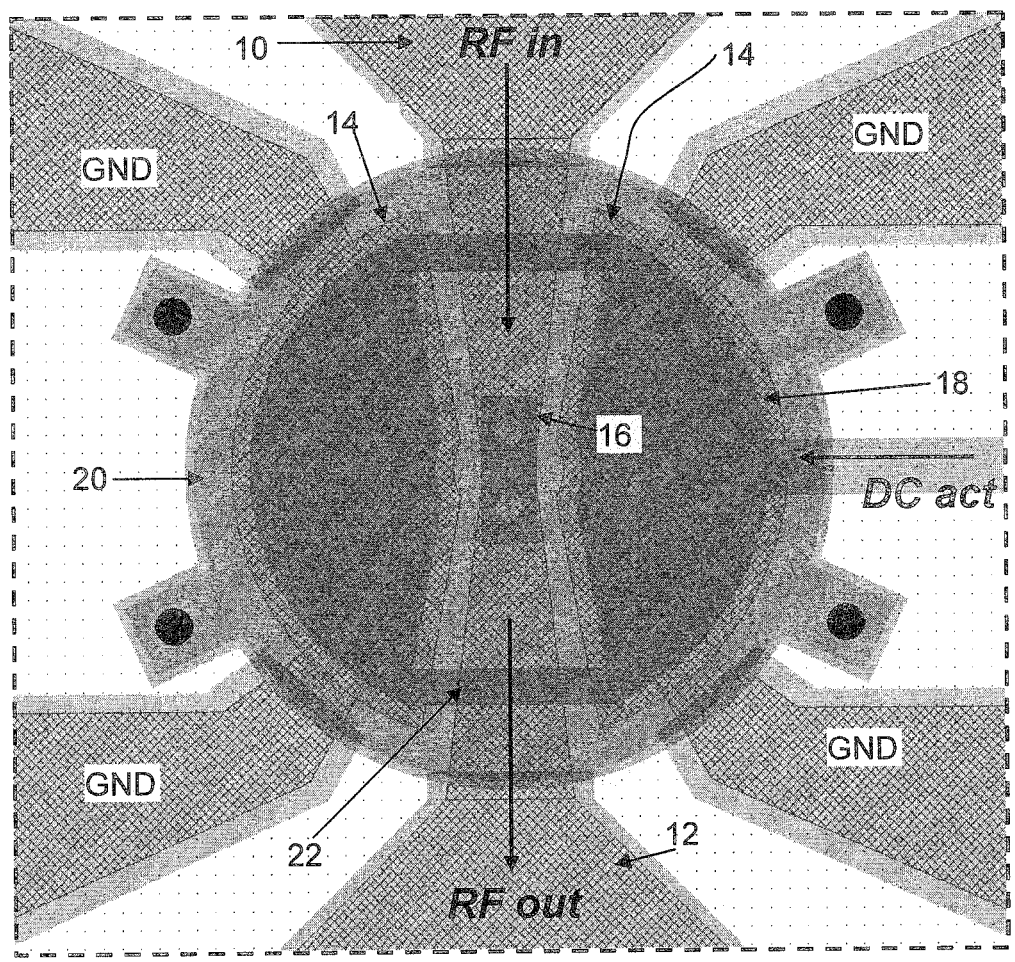
FIG. 1 shows a plan view of a known galvanic MEMS switch.
Figure 2:
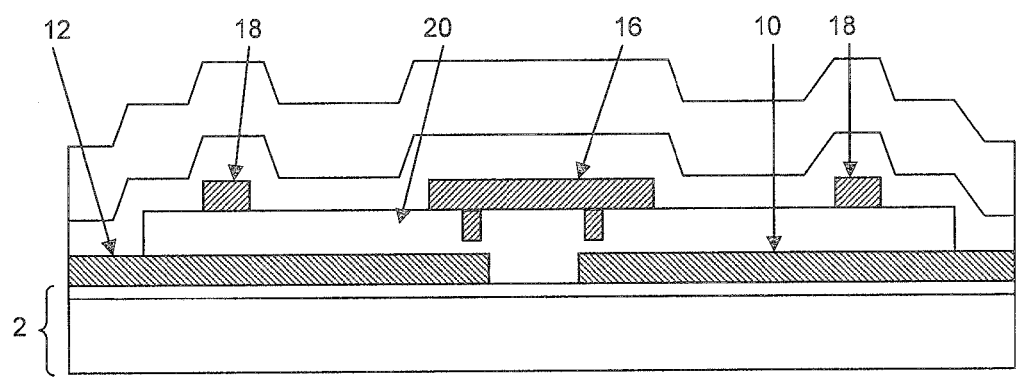
FIG. 2 shows the switch of FIG. 1 in cross section.

It has been proposed that the area of contacting surfaces in a contact type MEMS device can be reduced by defining protrusions on one or other of the opposing surfaces, as shown in FIG. 2. The area of these protrusions is made many times smaller then the area of the original surface.

This invention provides a method based on a spacer etch technique. Using this technique, the contacting area is defined by a film thickness rather than a film surface area.

Film thickness can easily be defined in the 100 nm range and therefore the contact area defined by this technique is orders of magnitude smaller than is possible with conventional patterning. The stiction force is correspondingly reduced since the stiction force scales with contacting area. Typically, the film thickness is less than 500 nm, and more preferably less than 250 nm Thus, the protrusion distance is also preferably less than 250 nm. However, the film thickness can be larger. If the film thickness is too small, then it might not be mechanically stable. Film thicknesses of 100 nm are possible, if also the protrusion distance is in that range. Thus, the desired film thickness depends somewhat on the protrusion distance.

For a MEMS microphone, the protrusion distance should be small, because otherwise the air flow resistance will increase. The protrusion distance can be in the range 50-200 nm and the film thickness can be in the range 100-500 nm Release occurs when the stiction force is smaller than the spring force resulting from the stiffness of the moveable element. Therefore this technique greatly reduces the chance of device failure due to stiction forces.

Figure 4:
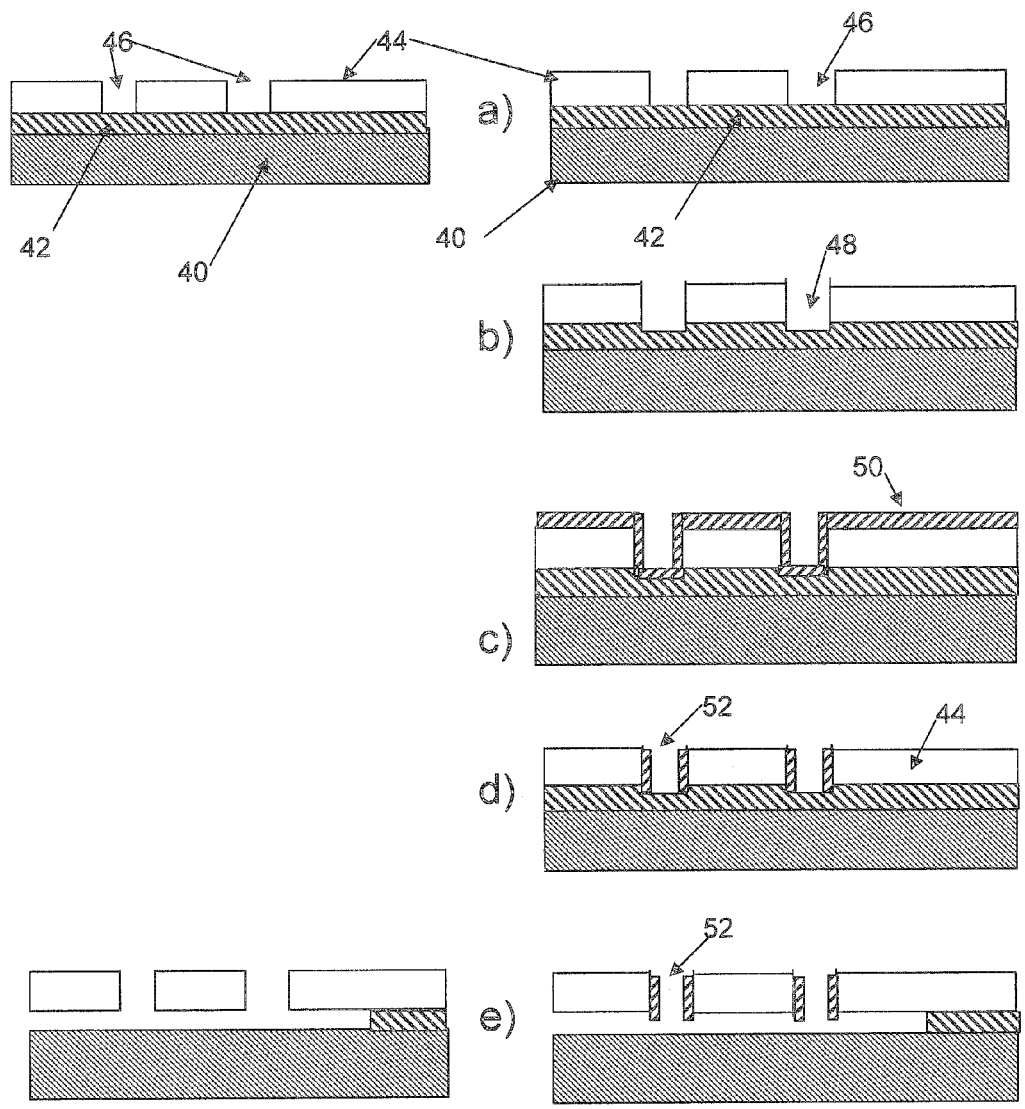
FIG. 4 (having FIGS. 4(a)-4(e)) shows a manufacturing method of the invention compared to a conventional process.
Figure 5:
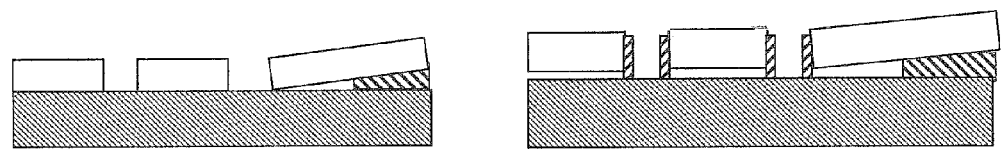
FIG. 5 shows a device of the invention compared to a conventional device and shows how stiction is avoided.

FIG. 4 shows the process of the invention, compared to a standard sacrificial release process which does not provide any anti-stiction bumps. FIG. 5 shows the resulting structures and illustrates the problem of stiction in the standard device.

The process of the invention is depicted on the right and is compared to a conventional flow depicted on the left.

Step a) shows the substrate 40, sacrificial layer 42 and structural layer 44 which will form the movable element of the MEMS device. The structural layer is etched down to the sacrificial layer with a pattern of openings 46. These act as etch holes for the sacrificial etch step. The sacrificial layer is typically SiO2, and the structural layer is typically Si.

Many different materials can be used as the sacrificial layer. Instead of SiO2, the sacrificial layer could be Al, other metals, polymers, SiNx, . . . etc.

Similarly, many different materials can be used as the structural layer Instead of Si, the structural layer could be SiN, metals, SiO2 (not in combination with a SiO2 sacrificial layer of course), Al2O3, . . . etc.

The conventional method then proceeds in step e) with the isotropic etch of the sacrificial layer. As shown in the left part of FIG. 5, the large contact area can result in a large stiction force which results in permanent stiction and device failure.

Figure 3:
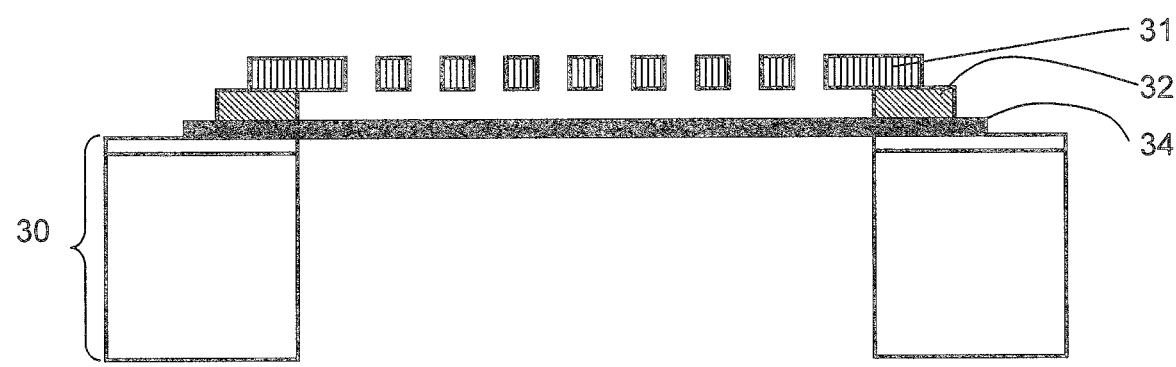
FIG. 3 shows a cross sectional view of a known MEMS microphone design.

The invention provides the additional steps shown as steps b) to d) in FIG. 3.

In step b), a small indent 48 is etched in the sacrificial layer by partially etching the sacrificial layer, using the patterned structural layer as a mask. Steps a) and b) can be combined into a single etch process step.

In step c), a spacer layer 50 is deposited, which may be comprised of SiNx or Si. This spacer layer covers the patterned structural layer, and extends over the side walls of the etch openings of the structural layer, as well as the partially etched indents 48 of the underlying sacrificial layer.

In step d), the spacer layer 50 is anisotropically etched such that the layer remains on the sidewalls but is removed from the bottom of the indent.

Thus, an inner coating 52 remains around the inner periphery of each etch opening 36, and it extends below the level of the structural layer 34.

In step e), the sacrificial material 52 is removed in an isotropic etch (as in the conventional process) for example using a HF solution for the example where the sacrificial layer is $SiO_2$ and the spacer layer is $SiN_x$ or Si (or Al2O3, $SiC_x$, $SiO_xN_y$).

The inner coatings 52 define a projection extending below the level of the structural layer.

As shown in FIG. 5, when the moveable element touches the underlying surface, the contacting area is defined by the layer thickness of the spacer layer 50 and the length of the periphery of the etch openings. This results in a very large decrease of contact area, and provides a simple process flow to enable the small contact area regions to be formed.

One process variant is that the etching in step b) can stop on a stopping layer, e.g., a PECVD SiN layer. The sacrificial layer deposition would then consist of three steps: a first sacrificial layer, e.g., SiO2, a stopping layer, and a second sacrificial layer. The advantage of a stopping layer would be a higher robustness against etch process variation. The sacrificial layer is then formed as an arrangement of multiple layers. Thus, in general, a sacrificial layer arrangement is used with one or more layers, depending on the process used.

This process reduces the contact the area more than conventionally etched bumps, since the contact area derives from the thickness of a deposited layer rather than the area of the pattern of the layer.

It also allows a much higher electrical isolation between electrodes than are prone to stiction. This is due to a large distance between the electrodes that can be filled by the spacer-dielectric (by selecting the depth of the partial etching of step b) accordingly).

This reduces the electrostatic forces and hence the electrostatic hysteresis. Electrical sticking failures such as charging are also avoided.

Another advantage over the proposed vertical arrangement over conventional isolation layers is that the mechanical stress in the dielectric layer influences the mechanical stress and stress gradient in the structural layer much less.

In the example of FIG. 4, the spacer layer 50 is made from an insulator. This assumes the device does not rely upon galvanic contact between the movable beam and the underlying substrate. For a galvanic contact device, an electrically conductive spacer layer 50 can be used, the total contact area will be designed to balance the contrary requirements of a low contact resistance and a low contact area.

In the case of an insulating layer 50, the electrostatic forces and charging are reduced. The projections defined by the inner coatings 52 are self-aligned, which gives a low number of mask steps.

There are other alternatives for anti-sticking bump or layer fabrication:

The location of the spacers can be defined by lithography in order to position the protrusions in the areas where they are needed most—the locations do not have to coincide with the etch openings. There can be separate etch openings and openings for the definition of the spacers.

Similarly, the spacer layer 50 can be patterned so that the side wall is not all around a sacrificial etch (or dedicated) opening—half of an opening may be coating so that the contact bump takes the shape of a semi-circular arc. The shape of an opening and the spacer layer can together be designed to form any desired shape of contact bump—for example a rectangular contact bump can be formed by providing a coating on only one straight side wall of an etch opening.

The gap between the beam and substrate (i.e. the thickness of the sacrificial layer) is typically around 2 μm, and may for example be in the range 0.1 to 10 μm.

The thickness of the layer 50 is typically around 250 nm and may for example be in the range 50 to 1000 nm.

The anisotropic etch process can be any reactive ion etch (RIE) process for example, as these all have some degree of anisotropy and can be used for this purpose.

The protrusion length may be around 100 nm, more generally between 20 nm and 500 nm.

The application is of interest for MEMS devices generally. A few examples of material have been given above. However, the invention is not limited to any particular choice of materials. The key concept is the conversion of a side wall coating into a contact area (perpendicular to the side wall). The coating material requires good adhesion to the side wall and sufficient strength for the contact bumps to remain integral. Other materials to those mentioned above, and satisfying these criteria will be immediately apparent to those skilled in the art.

Only the steps relevant to the formation of the contact bumps have been described above.

Additional processing steps will be carried out which do not relate to the formation of the contact bumps, and these can be before, after or between the processing steps described above. In particular, additional processing steps can be carried out between the steps described above and set out in the claims below. For the example of a microphone, the metal contacts for wire-bonding would be deposited after the spacer removal. The sacrificial etch would be last.

In the example above, the spacer layer is removed from the structural layer to leave only the side wall portion. However, the spacer layer could be deposited with the desired pattern so that the removal step is not needed. For example, the spacer layer could be deposited though a shadow mask. In this case, the spacer layer is only partially formed, i.e. formed with a pattern. The spacer layer could instead be porous or transparent for the sacrificial layer etchant.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A method of manufacturing a MEMS device, comprising:
   forming a sacrificial layer arrangement over a substrate;
   forming a structural layer over the sacrificial layer arrangement;
   patterning the structural layer to define at least one opening and partially etching the sacrificial layer arrangement at a base of the opening;
   forming a spacer layer at least partially over the structural layer, over a side wall of the at least one opening and over the partially etched sacrificial layer arrangement at the base of the opening, which side wall portion extends below the level of the structural layer;
   removing a portion of the spacer layer so that a part of the spacer layer remains on the side wall, to define at least one anti-stiction projection that corresponds to the part of the side wall that is covered by the spacer layer, wherein a contact area of the anti-stiction projection is at least partially defined by a thickness of the part of the spacer layer that remains, wherein the thickness is based upon the step of removing; and
   at least partially removing the sacrificial layer arrangement to form a suspended movable MEMS element.

2. A method as claimed in claim 1, wherein the at least partially removing the sacrificial layer arrangement comprises using the at least one opening as an etch hole.

3. A method as claimed in claim 1, wherein the at least partially removing the sacrificial layer arrangement comprises performing an isotropic etch step.

4. A method as claimed in claim 1, wherein the spacer layer comprises an insulator.

5. The method of claim 1, wherein
   forming the spacer layer includes forming a spacer layer on the side wall of the at least one opening and having a thickness that partially closes the opening, and
   at least partially removing the sacrificial layer arrangement includes etching the sacrificial layer via the at least one opening in which the spacer layer is formed.

6. A method as claimed in claim 1, further comprising, before at least partially removing the sacrificial layer arrangement, removing the spacer layer from the structural layer but leaving the side wall portion over the side wall of the at least one opening.

7. A method as claimed in claim 6, wherein the removing the spacer layer from the structural layer comprises performing an anisotropic etch step.

8. The method of claim 1, wherein removing the portion of the spacer layer so that a part of the spacer layer remains on the side wall includes anisotropically etching a portion of the spacer layer in the at least one opening and on a portion of the sacrificial layer below the at least one opening, the remaining portion of the spacer layer on a sidewall of the at least one opening having a thickness defined by the anisotropic etching.

9. The method of claim 8, wherein forming the spacer layer includes forming a spacer layer on opposing side walls of the at least one opening and on the portion of the sacrificial layer below the at least one opening, leaving a portion of the opening between the spacer layer on the opposing sidewalls unfilled.

10. A MEMS device comprising:
    a substrate; and
    a suspended movable MEMS element over the substrate defined by a structural layer, wherein the MEMS element has at least one opening having a side wall, wherein a spacer layer is provided over the side wall of the at least one opening and extending below a level of the structural layer, thereby defining anti-stiction projections beneath the structural layer that correspond to those portions of the side wall that are covered by the spacer layer, wherein a contact area of each of the anti-stiction projections is at least partly defined by a thickness of the spacer layer within the opening relative to an unfilled portion of the at least one opening adjacent the spacer layer, and the spacer layer does not cover a top surface of the MEMS element.

11. A device as claimed in claim 10, wherein the spacer layer comprises an insulator.

12. A device as claimed in claim 10, wherein the device comprises at least one of a MEMS switch, a capacitor, a resonator, an accelerometer, a microphone, a gyroscope, a pressure transducer, and an ultrasound transducer.

13. The device of claim 10, wherein the opening has opposing sidewalls and the spacer layer is provided on each of the opposing sidewalls and is separated by a portion of the opening therebetween.

* * * * *